(12) United States Patent
Hiraoka

(10) Patent No.: US 8,597,067 B2
(45) Date of Patent: Dec. 3, 2013

(54) METHOD OF MANUFACTURING ORGANIC ELECTROLUMINESCENCE DISPLAY DEVICE

(71) Applicant: Panasonic Corporation, Osaka (JP)

(72) Inventor: Tomomi Hiraoka, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/684,271

(22) Filed: Nov. 23, 2012

(65) Prior Publication Data

US 2013/0078883 A1 Mar. 28, 2013

Related U.S. Application Data

(63) Continuation of application No. PCT/JP2011/003100, filed on Jun. 2, 2011.

(30) Foreign Application Priority Data

Jun. 7, 2010 (JP) ................................. 2010-130527

(51) Int. Cl.
F23Q 23/08 (2006.01)
(52) U.S. Cl.
USPC ..................................... 445/3; 445/2; 445/24
(58) Field of Classification Search
USPC ............................................ 445/2, 3, 23–25
See application file for complete search history.

(56) References Cited

U.S. PATENT DOCUMENTS

| 7,728,797 | B2 | 6/2010 | Nagayama |
| 2002/0142697 | A1* | 10/2002 | Yamagata et al. ............... 445/24 |
| 2007/0273294 | A1 | 11/2007 | Nagayama |
| 2008/0057818 | A1 | 3/2008 | Ogawa |
| 2012/0264235 | A1 | 10/2012 | Hiraoka et al. |

FOREIGN PATENT DOCUMENTS

| JP | 2005-310659 | 11/2005 |
| JP | 2007-207703 | 8/2007 |
| JP | 2007-265633 | 10/2007 |
| JP | 2007-317384 | 12/2007 |
| JP | 2008-066003 | 3/2008 |

OTHER PUBLICATIONS

U.S. Appl. No. 13/659,084 to Tomomi Hiraoka, filed Oct. 24, 2012.
International Search Report in PCT/JP2011/003100, dated Aug. 2, 2011.

* cited by examiner

Primary Examiner — Anh Mai
Assistant Examiner — Andrew Coughlin
(74) Attorney, Agent, or Firm — Greenblum & Bernstein, P.L.C.

(57) ABSTRACT

A method of manufacturing an organic electroluminescence (EL) display device includes: identifying a defective pixel which includes an organic EL element having a short defect from among the pixels; applying a reverse bias voltage within a predetermined range to the pixel identified as the defective pixel; applying, for a certain period, a predetermined voltage to the pixel to which the reverse bias voltage is already applied, and measuring light emission luminance or pixel current of the pixel; and performing another repair process on the pixel having a temporal change amount in the measured light emission luminance or pixel current that is greater than or equal to a threshold.

6 Claims, 9 Drawing Sheets

METHOD OF MANUFACTURING ORGANIC ELECTROLUMINESCENCE DISPLAY DEVICE

CROSS REFERENCE TO RELATED APPLICATIONS

This is a continuation application of PCT Patent Application No. PCT/JP2011/003100 filed on Jun. 2, 2011, designating the United States of America, which is based on and claims priority of Japanese Patent Application No. 2010-130527 filed on Jun. 7, 2010. The entire disclosures of the above-identified applications, including the specifications, drawings and claims are incorporated herein by reference in their entirety.

FIELD

One exemplary embodiment disclosed herein relates generally to methods of manufacturing an organic electroluminescence display device, notably relating to an organic electroluminescence display device having an organic electroluminescence element that can be repaired.

BACKGROUND

Organic electroluminescence displays using organic electroluminescence elements (hereinafter, referred to as organic EL elements) are well-known as image display devices using current-driven light-emitting elements. Due to such advantages as excellent viewing angle characteristics and low power consumption, such organic EL displays have gained much attention as candidates for next-generation flat panel displays (FPDs).

Organic EL elements included in pixels are normally arranged in a matrix. For example, in an organic EL display device referred to as an active-matrix organic EL display, a thin film transistor (TFT) is provided in each crosspoint between scanning lines and data lines, and a holding capacitance element (condenser) and the gate of a drive transistor is connected to the TFT. The TFT is turned on through a selected scanning line so as to input a data signal from a data line to the drive transistor and the holding capacitance element, and a light emission timing for an organic EL element is controlled by such drive transistor and the holding capacitance element. With the configuration of the pixel drive circuit, in the active-matrix organic EL display, it is possible to cause the organic EL element to emit light until a subsequent scan (selection), and thus a reduction in display luminance is not incurred even when the duty ration increases. However, in the active-matrix organic EL display, a manufacturing process which requires microfabrication when a structure of a pixel is finer and thinner or when the number of pixels is greater, an electrical defect such as a short circuit and a release of the organic EL element occurs. Especially when the organic EL element has a short circuit defect, even if a forward direction bias voltage corresponding to a signal voltage is applied to a pixel having the organic EL element, current preferentially flows in a short circuit defect portion. As a result, current corresponding to a forward direction bias voltage does not flow in the organic EL element and the organic EL element does not emit light normally. With this, the pixel becomes a dark spot.

Conversely, Patent Literature 1 discloses a method of detecting a defective pixel arising in the organic EL element and repairing it in the manufacturing process of the organic EL display device. The manufacturing process of the organic EL display device disclosed in Patent Literature 1 includes manufacturing the organic EL element, detecting whether or not the organic EL element is shorted, and selectively applying a predetermined voltage to between a cathode and an anode of the detected organic EL element for performing open destruction on the shorted defective portion. With this, in the shorting defective pixel, it is possible to perform open destruction on the shorted defective portion without degrading the normal portion and to repair the shorted defective portion.

CITATION LIST

Patent Literature

Patent Literature 1: Japanese Unexamined Patent Application

SUMMARY

Technical Problem

However, in the method of repairing the shorted defective pixel, an open portion after the repair is reconstructed by swelling due to heat caused by light-emitting operation after the repair, and the portion may be shorted again. With this, after product shipments, the shorted defective pixel may have a dark spot.

One non-limiting and exemplary embodiment provides a method of manufacturing an organic EL display device which does not cause a subsequent short defect after a repair.

Solution to Problem

In one general aspect, the techniques disclosed here feature a method of manufacturing an organic EL display device which includes pixels each of which includes an organic EL element, the method comprising: identifying a defective pixel that includes an organic EL element having a short defect from among the pixels; applying a reverse bias voltage for eliminating the short defect to the pixel identified as the defective pixel in the identifying of a defective pixel, the reverse bias voltage being within a predetermined range; applying, for a certain period, a voltage having an absolute value that is less than or equal to the reverse bias voltage to the pixel to which the reverse bias voltage is already applied in the applying of a reverse bias voltage, and measuring light emission luminance or pixel current of the pixel in the certain period; identifying, as a defective pixel that needs to be repaired, a pixel having a temporal change amount in the light emission luminance or the pixel current measured in the measuring that is greater than or equal to a threshold; and repairing the pixel using a technique different from the technique of applying the reverse bias voltage, the pixel being identified in the identifying of a defective pixel that needs to be repaired.

Additional benefits and advantages of the disclosed embodiments will be apparent from the Specification and Drawings. The benefits and/or advantages may be individually obtained by the various embodiments and features of the Specification and Drawings, which need not all be provided in order to obtain one or more of such benefits and/or advantages.

Advantageous Effects

The method of manufacturing the organic EL display device according to the present disclosure performs another repairing method such as laser repair with respect to a pixel in which a possibility of having a dark spot again is found, by introducing a step for checking the occurrence of a subsequent short defect in a pixel after electrical repair. With this, it is possible to simplify the manufacturing process, to send only the high-quality display panel without a subsequent pixel defect to the subsequent process, and to provide an organic EL display device having high reliability.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENT

Figure 1:
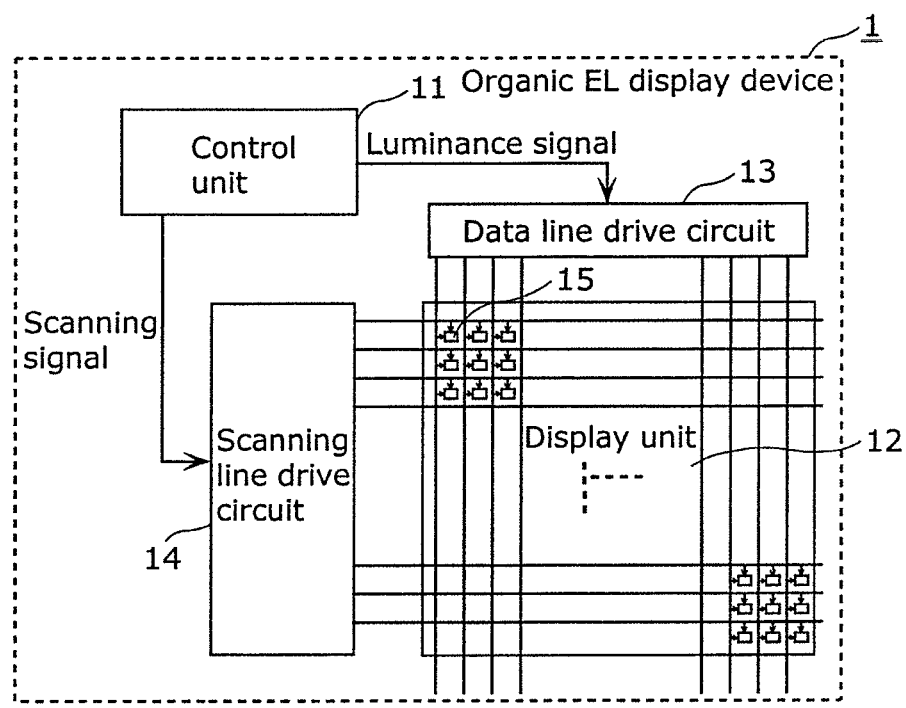
FIG. 1 is a functional block diagram showing a configuration of an organic EL display device according to one exemplary embodiment.

A method according to an exemplary embodiment disclosed herein is a method of manufacturing an organic EL display device which includes pixels each of which includes an organic EL element, the method comprising: identifying a defective pixel that includes an organic EL element having a short defect from among the pixels; applying a reverse bias voltage for eliminating the short defect to the pixel identified as the defective pixel in the identifying of a defective pixel, the reverse bias voltage being within a predetermined range; applying, for a certain period, a voltage having an absolute value that is less than or equal to the reverse bias voltage to the pixel to which the reverse bias voltage is already applied in the applying of a reverse bias voltage, and measuring light emission luminance or pixel current of the pixel in the certain period; identifying, as a defective pixel that needs to be repaired, a pixel having a temporal change amount in the light emission luminance or the pixel current measured in the measuring that is greater than or equal to a threshold; and repairing the pixel using a technique different from the technique of applying the reverse bias voltage, the pixel being identified in the identifying of a defective pixel that needs to be repaired.

Conventionally, a measure has been taken to eliminate the short defect by applying a reverse bias voltage to an organic EL element having a short defect and to prevent an escape of a defective pixel having the organic EL element. Before the repair by the application of the reverse bias voltage, the pixel having the short defect does not normally emit light as the whole of the pixel, while the pixel after the repair process has a black spot in the shorted defective portion but normally emits light in the remaining luminescence region. However, even if a reverse bias voltage is applied for repair, the portion which is open after the repair process can be deformed by swelling due to heat caused by light-emitting operation after the repair, and the pixel may be shorted again after product shipment with a result that the pixel has a dark spot.

With the present aspect, after the pixel having an organic EL element with a short defect is electrically repaired by the application of a reverse bias voltage, a temporal change in pixel current or light emission luminance detected by the application of a predetermined voltage for a certain period is observed. Then, from the observed temporal change, another repair such as laser repair is performed on the pixel that is determined to have a possibility to have a dark spot again. With this, it is possible to certainly prevent the occurrence of a subsequent pixel defect in a pixel that is repaired. With this, it is possible to simplify the manufacturing process, to send only the high-quality product without a subsequent pixel defect to the subsequent process, and to provide an organic EL display device having high reliability.

Moreover, in the method of manufacturing the organic EL display device according to an aspect of the present disclosure, it is desirable that in the applying of a reverse bias voltage, leakage current is measured, and the reverse bias voltage is continuously applied until the leakage current is less than or equal to a predetermined value, and in the measuring, the voltage is applied, for a certain period, to the pixel having leakage current that is less than or equal to a predetermined value in the applying of a reverse bias voltage, and light emission luminance or pixel current of the pixel is measured.

With the present aspect, in the application of the reverse bias voltage, a reverse bias voltage is continuously applied for eliminating the short defect of the organic EL element. It is determined that the pixel in which leakage current detected by the application of the reverse bias current decreases to less than or equal to a predetermined value corresponding to elapsed time eliminated the short defect, and then a pixel characteristics measurement is performed only on the pixel. With this, since the pixel characteristics measurement is efficiently performed, the efficiency of the manufacturing process can be increased.

In the method of manufacturing the organic EL display device according to the present disclosure, it is desirable that in the applying of a reverse bias voltage, the repairing is further performed on the pixel having leakage current that is not less than or equal to a predetermined value even when the reverse bias voltage is applied for a certain period.

With the present aspect, it is determined that the pixel in which leakage current detected by the application of the reverse bias current does not decrease to less than or equal to a predetermined value even after a certain period does not eliminate the short defect, and then another repair process is performed on the pixel. With this, it is possible to cause the pixel which does not eliminate the short defect even after the application of a reverse bias voltage to certainly eliminate the short defect. Therefore, the load of the pixel characteristics measurement that is the subsequent process can be reduced and it is possible to provide an organic EL display device having high reliability.

It is desirable that in the repairing, laser is used for repair.

With the present aspect, regarding the pixel which cannot be a normal pixel even after the application of a reserve bias voltage within a predetermined range and the pixel which temporarily became a normal pixel by the application of the reverse bias voltage but is determined to have a possibility to become a subsequent defective pixel in the pixel characteristics measurement, although the length of a process is greater than the repair by the application of the reverse bias voltage, it is possible to irradiate, with a laser, a short circuit portion of the organic EL element having the pixel for certainly blocking a short circuit pass. Therefore, it is possible to send only the display panel having only normal pixels to the subsequent process and to provide an organic EL display device having high reliability.

It is desirable that the absolute value of the reverse bias voltage in the predetermined range in the applying of a reverse bias voltage varies from 15 V to 25 V inclusive.

When the absolute value of the reverse bias voltage is less than 15 V, the leakage current caused by the reverse bias voltage preferentially flows in the shorted defective portion of the organic EL element. However, since the leakage current destroys the shorted defective portion, Joule heat cannot be sufficiently generated for destroying the shorted defective portion and it is impossible to certainly destroy the shorted defective portion. Moreover, when the absolute value of the reverse bias voltage is greater than 25 V, current flows also in the normal portion which exists in parallel with the shorted defective portion and melt fracture may occur to not only the shorted defective portion but also the layered structure of the normal portion.

With the present aspect, it is possible to preferentially flow an appropriate amount of current which can destroy the shorted defective portion without destroying the normal portion of the organic EL element.

In the method of manufacturing the organic EL display device according an aspect of the present disclosure, it is desirable that the temporal change amount is a value which is obtained by dividing an absolute value of a difference between (i) one of the light emission luminance and the pixel current that are measured in the measuring at a starting point of the certain period and (ii) a corresponding one of the light emission luminance and the pixel current that are measured in the measuring at a point of the predetermined period, by one of the light emission luminance and the pixel current that are measured at the starting point of the predetermined period, and the threshold is 5 percent.

In the reverse voltage application, when the pixel which is determined to have eliminated the short defect of the organic EL element is subsequently caused to generate a short defect, the shorted defective portion has come to have a short circuit component. The shorted defective portion of the organic EL element which has come to have the short circuit component is reconstructed by the continuous application of a predetermined bias voltage, and a resistance value of the short circuit component decreases over time. Therefore, by the continuous application of a predetermined bias voltage, current which flows in the organic EL element, usually, monotonically increases over time.

With the present aspect, when a temporal change amount of pixel current or light emission luminance which is detected by the application of a predetermined bias voltage for a certain period is determined by a threshold, the threshold is caused to tolerate a predetermined error. With this, rather than determining a defective pixel by only a slight temporal change in pixel current or light emission luminance stemming from measurement error or a factor other than the short defect, it is possible to determine, as a defective pixel, only the pixel in which a subsequent short defect in which the detected pixel current and light emission luminance tend to monotonically increase over time occurs.

Embodiment

Hereinafter, a certain exemplary embodiment is described in greater detail with reference to the accompanying Drawings.

The exemplary embodiment described below shows a general or specific example. The numerical values, shapes, materials, structural elements, the arrangement and connection of the structural elements, steps, the processing order of the steps etc. shown in the following exemplary embodiment are mere examples, and therefore do not limit the scope of the appended Claims and their equivalents. Therefore, among the structural elements in the following exemplary embodiment, structural elements not recited in any one of the independent claims are described as arbitrary structural elements.

The method of manufacturing the organic EL display device according to the present disclosure includes: identifying a defective pixel that includes an organic EL element having a short defect from among the pixels; applying a reverse bias voltage for eliminating the short defect to the pixel identified as the defective pixel in the identifying of a defective pixel, the reverse bias voltage being within a predetermined range; applying, for a certain period, a voltage having an absolute value that is less than or equal to the reverse bias voltage to the pixel to which the reverse bias voltage is already applied in the applying of a reverse bias voltage, and measuring light emission luminance or pixel current of the pixel in the certain period; identifying, as a defective pixel that needs to be repaired, a pixel having a temporal change amount in the light emission luminance or the pixel current measured in the measuring that is greater than or equal to a threshold; and repairing the pixel using a technique different from the technique of applying the reverse bias voltage, the pixel being identified in the identifying of a defective pixel that needs to be repaired. With this, it is possible to certainly prevent the occurrence of a subsequent pixel defect of a pixel that is repaired. With this, it is possible to simplify the manufacturing process, to send only the high-quality product without causing a subsequent pixel defect to the subsequent process, and to provide an organic EL display device having high reliability.

The following will describe the embodiment according to the present disclosure with reference to drawings. First, a configuration of the organic EL display device which is subject to the manufacturing method according to the present disclosure.

FIG. 1 is a functional block diagram showing a configuration of the organic EL display device according to the embodiment. An organic EL display device 1 shown in FIG. 1 includes a control unit 11, a display unit 12, a data line drive circuit 13, and a scanning line drive circuit 14.

The control unit 11 converts a video signal that is input externally into a signal voltage which determines luminescence of the pixel, and then outputs the signal voltage to the data line drive circuit 13 in a scan order. Moreover, the control unit 11 controls a timing for outputting a signal voltage outputted from the data line drive circuit 13 and a timing for outputting a scan signal outputted from the scanning line drive circuit 14.

The data line drive unit 13 outputs a signal voltage to each of the data lines, to realize luminescence of the pixel corresponding to the video signal.

The scanning line drive circuit 14 outputs a scan signal to each of the scanning lines, to drive a circuit element having the pixel at a predetermined drive timing.

In the display unit 12, a plurality of pixels are provided in a matrix shape. Each of the pixels emits light in correspondence with a luminance signal from the data line drive circuit 13 and a scan signal from the scanning line drive circuit 14.

Figure 2A:
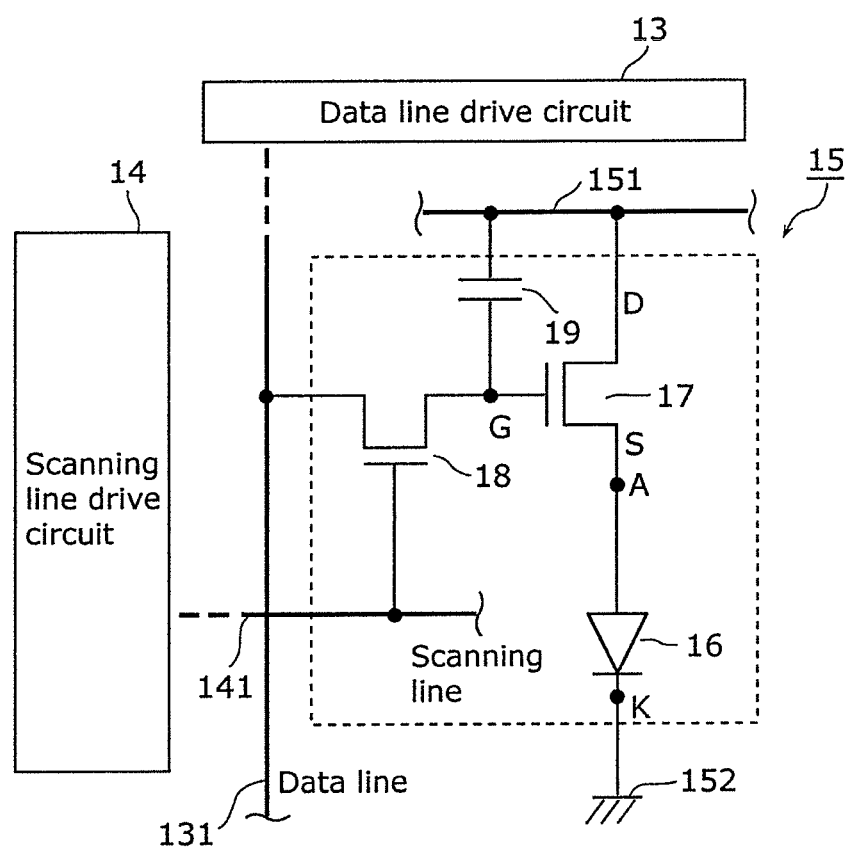
FIG. 2A is a block diagram of a circuit of a normal pixel included in the organic EL display device.

FIG. 2A is a block diagram of a circuit of a normal pixel included in the organic EL display device. A pixel 15 shown in FIG. 2A includes an organic EL element 16, a drive transistor 17, a selection transistor 18, and a condenser 19. Moreover, a data line 131 is provided in each of the pixel columns, a scanning line 141 is provided in each of the pixel rows, and a positive power wire 151 and a negative power wire 152 are provided to all pixels 15. A drain electrode of the selection transistor 18 is connected to the data line 131, a gate electrode of the selection transistor 18 is connected to the scanning line 141, a source electrode of the selection transistor 18 is connected to the condenser 19 and a gate electrode of the drive transistor 17. Moreover, the drain electrode of the drive transistor 17 is connected to the positive power wire 151, and the source electrode is connected to an anode of the organic EL element 16.

Here, a structure of the organic EL element 16 will be described.

Figure 3:
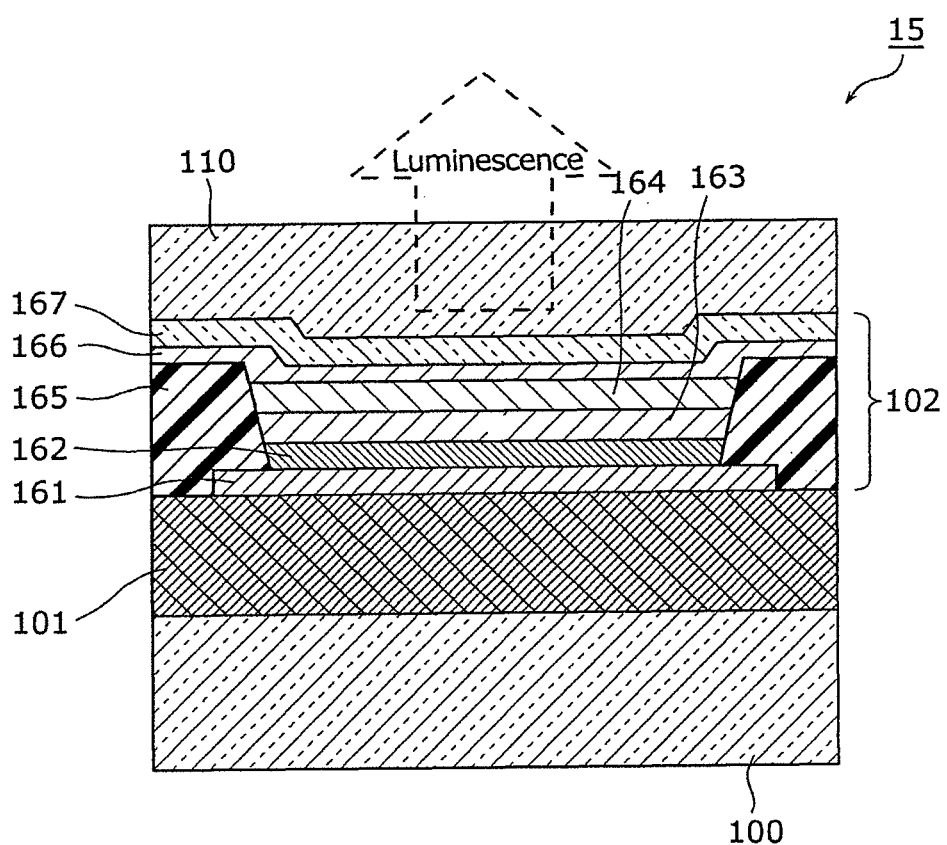
FIG. 3 is a cross-sectional structural view of a pixel according to one exemplary embodiment.

FIG. 3 is a cross-sectional structural view of a pixel according to the present embodiment. The pixel 15 shown in FIG. 3 includes a substrate 100, a drive circuit layer 101, a luminescent layer 102, and a transparent encapsulating film 110.

The substrate 100 is, for example, a glass substrate. Moreover, the substrate 100 may use a flexible substrate made of resin. The substrate 100, along with the drive circuit layer 101, constitutes a thin film transistor (TFT) substrate. It should be noted that in a top emission structure shown in FIG. 3, the substrate 100 does not have to be transparent. For example, a non-transparent substrate such as silicon substrate can be used.

The drive circuit layer 101, although not illustrated, includes the drive transistor 17, the condenser 19, and the selection transistor 18 that are formed above the substrate 100. The drive circuit layer 101 is provided with flatness on the upper surface by a flattening film.

The luminescent layer 102 is a layer which constitutes the organic EL element 16. The luminescent layer 102 includes an anode 161, a hole injection layer 162, a hole transport layer 163, an organic luminescent layer 164, a bank layer 165, an electron injection layer 166, and a transparent cathode 167.

The pixel 15 shown in FIG. 3 has a top emission structure. In other words, when a voltage is applied to the luminescent layer 102, light is generated at the organic luminescent layer 164, and then light emits upward via the transparent cathode 167 and the transparent encapsulating film 110. Moreover, light which is generated by the organic luminescent layer 164 and emits downward is reflected by the anode 161, and light emits upward via the transparent cathode 167 and the transparent encapsulating film 110.

The anode 161 is laminated on the surface of the flattening film of the drive circuit layer 101 and is an electrode which applies a positive voltage with respect to the transparent cathode 167 to the luminescent layer 102. It is desirable that a material constituting the anode 161 is one of Al and Ag that are metals having high reflection ratio, or an alloy of the two metals. Moreover, the anode 161 has a thickness of around 100 mm to 300 mm, for example.

The hole injection layer 162 is formed on the surface of the anode 161, and has a function to reliably inject holes into the organic luminescent layer 164 and a function to support the reliable generation of the holes for injection into the organic luminescent layer 164. With this, the drive voltage of the luminescent layer 102 can be lower and an element can have a longer lifetime due to stability of the hole injection. A material for the hole injection layer 162 may be polyethyl-enedioxythiophene (PEDOT) and the like, for example. It is desirable that the hole injection layer 162 has a film thickness of around 10 nm to 100 nm, for example.

The hole transport layer 163 is formed on the surface of the hole injection layer 162, efficiently transports a hole injected from the hole injection layer 162 to the organic luminescent layer 164, prevents deactivation of an exciton on an interface between the organic luminescent layer 164 and the hole injection layer 162, and further has a function to block an electron. A material for the hole transport layer 163 is an organic polymeric material having characteristics of transmitting the generated hole by charge transfer reaction between molecules. For example, tryphenylamine and polyaniline can be cited. The hole transport layer 163 has a thickness of around 5 nm to 50 nm, for example.

It should be noted that there is a case where the hole transport layer 163 is omitted depending on a material for the hole injection layer 162 and the organic luminescent layer 164 that are adjacent layers.

The organic luminescent layer 164 is formed on the surface of the hole transport layer 163, and has a function to recombine by injection of the hole and the electron, to generate excitation and emit light. A material for the organic luminescent layer 164 can be not only a low molecular organic material but also an organic polymeric material having luminescence in which a film can be manufactured by a wet film forming method represented by ink jet and spin coating. The characteristics of the organic polymer material include the fact that a device structure is simple, film reliability is high, and it is a low-voltage drive device. Since a polymer or a Π-type conjugated polymer having a conjugated system such as aromatic ring or condensed ring has fluorescence, it can be used as an organic polymeric material that constitutes the organic luminescent layer 164. A material for the polymeric luminescent material that constitutes the organic luminescent layer 164 includes, for example, polyphenylene vinylene (PPV) or its derivative (PPV derivative), polyfluorene (PFO) or its derivative, and a polyspirofluorene derivative. Moreover, polythiophene or its derivative can also be used.

The bank layer 165 is formed on the surface of the hole injection layer 162 and has a function as a bank which forms, in a predetermined region, the hole transport layer 163 and the organic luminescent layer 164 formed in a wet film forming method. A material for the bank layer 165 may be an inorganic substance or an organic substance, but the organic substance can be more suitably used than the inorganic substance because the organic substance generally has high water repellency. An example of such material includes a resin such as polyimide and polyacrylic. The bank layer 165 has a thickness of around 100 mm to 3000 mm, for example.

The electron injection layer 166 is formed on the organic luminescent layer 164. It has a function to reduce a barrier of electron injection into the organic luminescent layer 164, to lower the drive voltage of the luminescent layer 102, and to restrict exciton deactivation. With this, electron injection is reliable enough to extend the lifetime of the element, and the number of element defects can be decreased by improving evenness of the light-emitting surface through increasing adhesion with the transparent cathode 167. A material for the electron injection layer 166 is not especially limited. However, it is desirable that the material is made of barium, aluminum, phthalocyanine, lithium fluoride, and barium-aluminum laminate. The electron injection layer 166 has a thickness of around 2 nm to 50 nm, for example.

The transparent cathode 167 is laminated on the surface of the electron injection layer 166, and has a function to apply a negative voltage with respect to the anode 161 to the luminescent layer 102 and to inject an electron into the element (especially, the organic luminescent layer 164). A material for the transparent cathode 167 is not especially limited. However, it is desirable that a substance and a structure which have high permeability are used. With this, it is possible to implement a top emission organic EL element having high luminous efficiency. A configuration of the transparent cathode 167 is not especially limited. However, a metal oxide layer is used. The metal oxide layer is not especially limited. However, a layer made of indium tin oxide (ITO) or indium zinc oxide (IZO) is used. Moreover, the transparent cathode 167 has a thickness of around 5 nm to 200 nm.

The transparent encapsulating film 110 is formed on the surface of the transparent cathode 167 and has a function to protect the element from moisture. Moreover, the transparent encapsulating film 110 needs to be transparent. The transparent encapsulating film 110 is made of SiN, SiON, or an organic film. Moreover, the transparent encapsulating film 110 has a thickness of around 20 nm to 5000 nm, for example.

With the above described structure of the pixel 15, the organic EL display device 1 has a function as an active-matrix display device.

In the above configuration, when a scan signal is input to the scanning line 141 and the selection transistor 18 is turned on, a voltage corresponding to the signal voltage supplied via the data line 131 is written in the condenser 19. Then, the holding voltage corresponding to the signal voltage written in the condenser 19 is held through a frame period. By the holding voltage, the conductance of the drive transistor 17 changes in an analog manner and drive current corresponding to a luminescence gray level is supplied to the anode of the organic EL element 16. Furthermore, the drive current supplied to the anode of the organic EL element 16 flows to the cathode of the organic EL element 16. With this, the organic EL element 16 emits light and is displayed as an image. At this time, a forward bias voltage corresponding to the signal voltage is applied to the anode of the organic EL element 16.

It should be noted that a circuit configuration of the above described pixel is not limited to the circuit configuration shown in FIG. 2A. The selection transistor 18 and the drive transistor 17 are circuit constituent elements necessary for flowing the drive current corresponding to the signal voltage to the organic EL device 16. However, they are not limited to the above described embodiment. Moreover, when a configuration in which another circuit configuration element is added to the above described circuit configuration element, it is included in the pixel circuit of the organic EL display device according to the present disclosure.

However, in the active-matrix organic EL display, a manufacturing process which requires microfabrication when a structure of a pixel is finer and thinner or when the number of pixels is greater, an electrical defect such as a short circuit and a release between the anode and cathode of the organic EL element occurs.

Figure 2B:
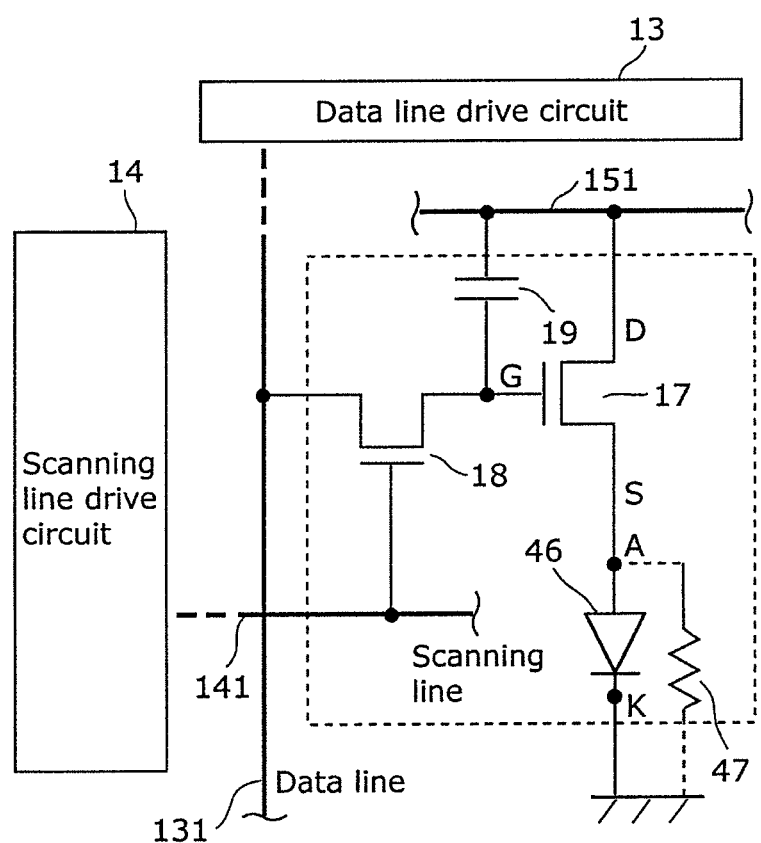
FIG. 2B is a block diagram of a circuit of a defective pixel included in the organic EL display device.

FIG. 2B is a block diagram of a circuit of a defective pixel included in the organic EL display device. The circuit configuration shown in FIG. 2B indicates a state in which a short circuit exists between the anode and the cathode of the organic EL element. In other words, compared with the circuit configuration shown in FIG. 2A, the difference is that a short circuit component 47 which realizes electrical conduction between the anode and cathode of an organic EL element 46 is connected in parallel. Here, the state in which the organic EL element 46 is shorted means that when the resistance value of the short circuit component 47 is low resistant, the organic EL element 46 is in a short circuit state. As an example of the short circuit state between the anode and cathode of the organic EL element 46, it is believed that the hole transport layer 163 and the electron injection layer 166 which sandwich the organic luminescent layer 164 is in point contact with each other via a pinhole generated in the organic luminescent layer 164, due to unevenness of the film thickness of the organic luminescent layer 164 shown in FIG. 3.

Even when a forward bias voltage corresponding to the signal voltage is applied to a defective pixel shown in FIG. 2B, a short circuit current flows in the short circuit component 47. As a result, current corresponding to a forward bias voltage does not flow in the organic EL element 46 and therefore does not emit light normally. With this, the defective pixel becomes a dark spot.

In order to ensure display quality of the organic EL display panel, it is necessary to prevent an escape of a defective pixel having the short circuit component 47. Therefore, when the defective pixel is generated in the manufacturing process, it is necessary to certainly repair the defective pixel. A repair process for eliminating the short circuit component 47 includes, for example, irradiating the existence position of the short circuit component 47 with a laser. With this, when a forward bias voltage is applied to a laser-repaired pixel and the pixel normally emits light, the repair portion becomes a black spot but normal luminescence is performed in the remaining luminescence area.

Meanwhile, in addition to the laser repair, there is a repair method of applying a reverse bias voltage to an organic EL element in a short circuit state, flowing current in the short circuit component 47, and generating Joule heat, to reconstruct the shorted defective portion and to make it open. The method can be applied to an electrical characteristics measurement device for identifying a defective pixel, and it is not necessary to prepare another device for the repair. Conversely, the repair method using laser irradiation needs to prepare another laser device and to highly accurately position a surrounding portion of the shorted defective portion which is a laser irradiation target such that the portion is not damaged. Moreover, in both repair methods, the shorted defective pixel before the repair process does not normally emit light as the whole of the pixel, while in the pixel after the repair process, the shorted defective portion becomes a black spot but the remaining luminescence area comes to normally emit light.

In a viewpoint of simplifying the manufacturing process and reducing cost, it is desirable that as the repair method the shorted defective pixel, a method of opening the shorted defective portion by the application of a reverse bias voltage is preferentially used.

However, even if a reverse bias voltage is applied and electrical repair is performed, the portion which is open after the repair process can be deformed by swelling due to heat caused by a light-emitting operation after the repair, and the pixel that is electrically repaired may be shorted again after product shipment with a result that the pixel has a dark spot.

In the method of manufacturing the organic EL display device according to the present disclosure, after an electric repair is performed on the pixel having a short defect by applying a reverse bias voltage, the electrical repair is checked by observing a temporal change in the pixel current or the light emission luminance detected by applying a predetermined bias voltage for a certain period. Then, from the observed temporal change, another repair such as laser repair is performed on the pixel which is determined to have a possibility to have a dark spot again. With this, it is possible to certainly prevent the occurrence of a subsequent pixel defect of a pixel that is repaired. With this, it is possible to simplify the manufacturing process, to send only the high-quality product without a subsequent pixel defect to the subsequent process, and to provide an organic EL display device having high reliability. The following will describe a method of manufacturing the organic EL display device according to the present disclosure.

Figure 4:
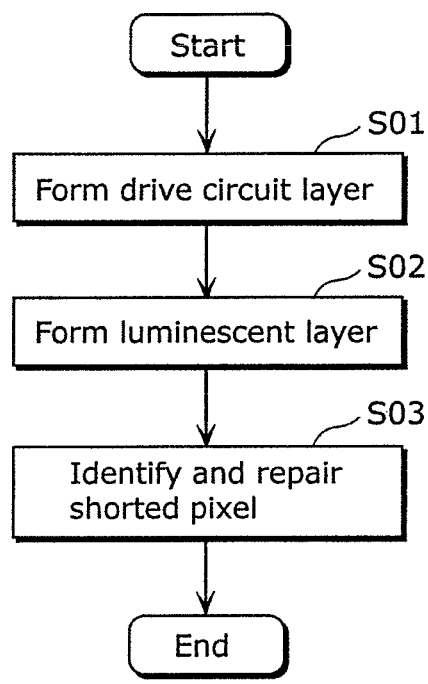
FIG. 4 is an operational flowchart for showing a method of manufacturing the organic EL display device according to one exemplary embodiment.

FIG. 4 is an operational flowchart for showing a method of manufacturing the organic EL device according to the embodiment. The method of manufacturing the organic EL display device according to the preset disclosure includes forming a drive circuit layer, forming a luminescent layer, detecting a shorted defective pixel, performing an electrical repair, checking the electrical repair, and performing laser repair.

First, the drive circuit layer 101 is formed in which the drive transistor 17, the selection transistor 18, the condenser 19, the circuit wiring, and the like are appropriately disposed (S01).

More specifically, as a layer of the drive circuit layer 101 shown in FIG. 3, a lower electrode layer made of an alloy of Mo and W is formed using such technique as metal mask film forming, liftoff, and etching. Here, the lower electrode layer is one of the electrodes of the condenser 19. It is formed to connect the source electrode of the selection transistor 18 with the gate electrode of the drive transistor 17. Next, on the lower electrode layer, for example, an insulating layer made of SiOx, SiN, or the like is formed to cover the lower electrode layer. At this time, it is desirable that the surface of the insulating layer is flattened where necessary. Next, on the insulating layer, with the use of such techniques as the metal mask film forming, liftoff, and etching, for example, an upper electrode layer comprising a stacked structure of an alloy of Mo and W and an alloy of Al/Mo and W is formed. Here, the upper electrode layer is another electrode of the condenser 19. It is formed such that the positive power wire 151 is connected with the drain electrode of the drive transistor 17.

Next, after the flattening process for the drive circuit layer 101, the luminescent layer 102 having the organic EL element 16 is formed on the drive circuit layer 101 (S02).

More specifically, the luminescent layer 102 includes, for example, an anode, a hole injection layer, a hole transport layer, an organic luminescent layer, a bank layer, an electron injection layer, and a transparent cathode.

Next, the pixel having the organic EL element 46 with a short defect is identified and a repair is performed on the pixel (S03). The following will describe in detail Step S03 that is the main component of the present disclosure.

Figure 5:
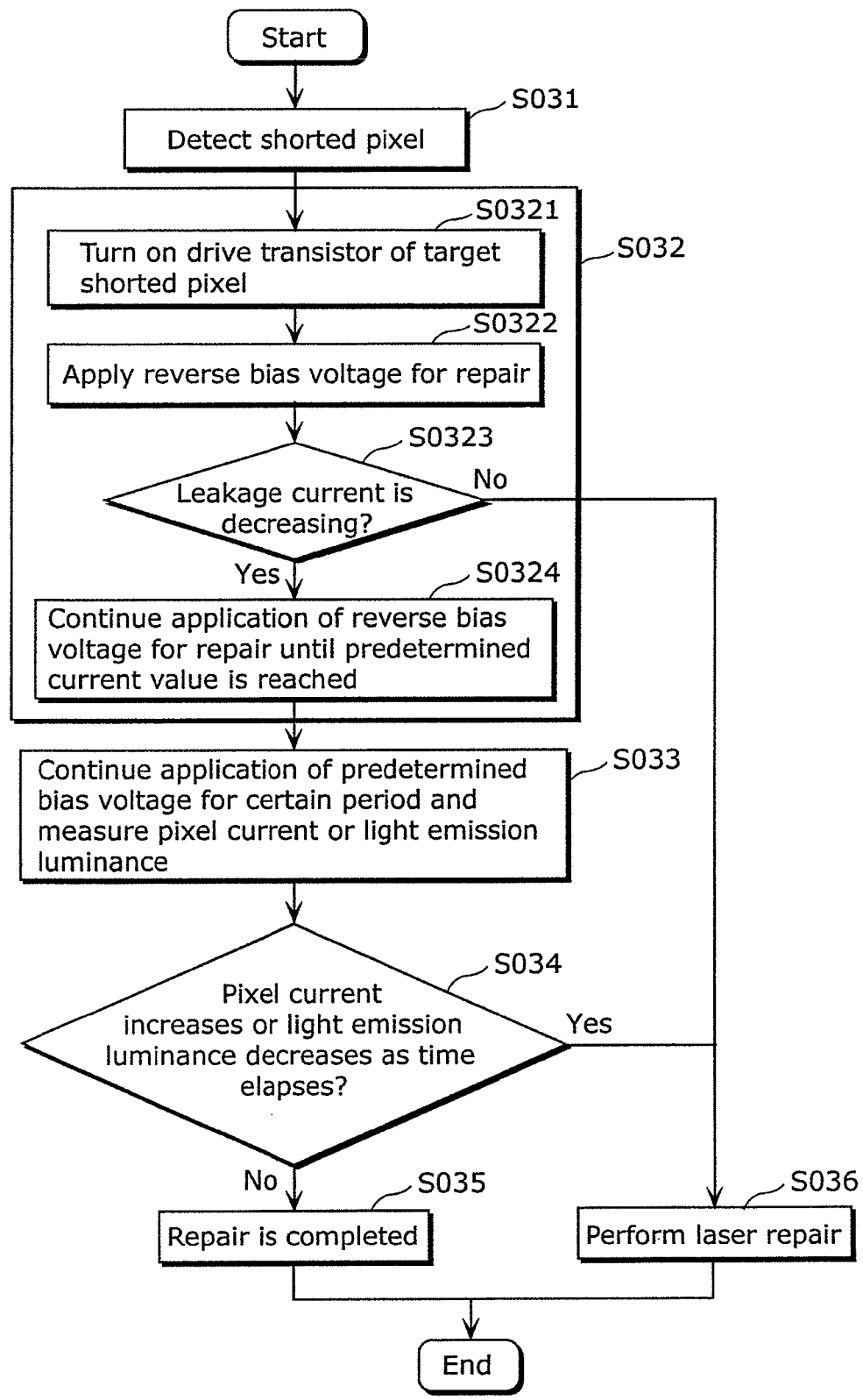
FIG. 5 is an operational flowchart for explaining Step S03 according to one exemplary embodiment.

FIG. 5 is an operational flowchart for describing Step S03 according to the present embodiment.

Figure 6:
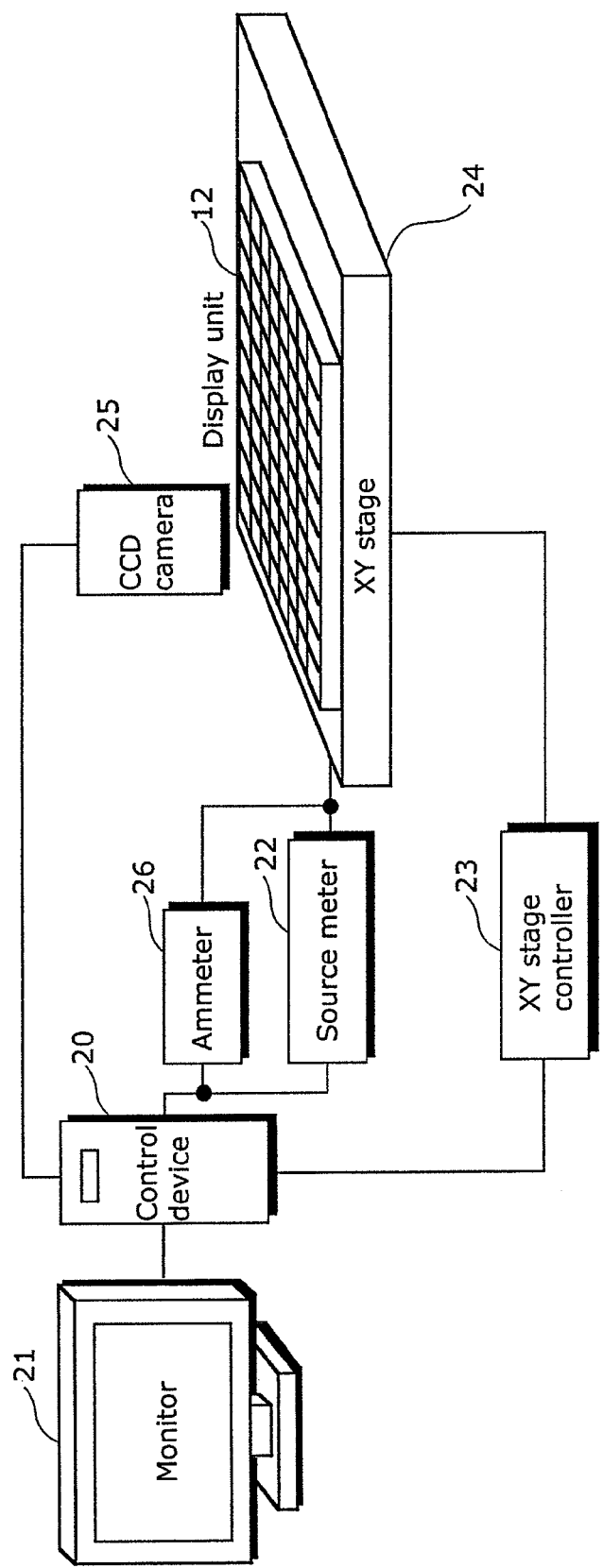
FIG. 6 is a block diagram of a system which performs Step S03 according to one exemplary embodiment.

Moreover, FIG. 6 is a block diagram of a system which performs Step S03 according to the present embodiment. The system shown in FIG. 6 includes a control device 20, a monitor 21, a source meter 22, an XY stage controller 23, an XY stage 24, a Charge Coupled Device (CCD) camera 25, and an ammeter 26. Moreover, FIG. 6 describes a scene when the luminescence state of the display unit 12 included in the organic EL display device 1 is imaged by the CCD camera 25.

The control device 20 causes the source meter 22 to apply a forward bias voltage or a reverse bias voltage to each of the pixels 15 included in the display unit 12. Moreover, the control device 20 causes the XY stage controller 23 to shift the XY stage 24 such that the CCD camera 25 can image the luminescence state of the pixel 15 which is an imaging target. Moreover, the control device 20 causes the CCD camera 25 to image the luminescence state of the pixel which is an imaging target in the above described period, and then obtains the image from the CCD camera 25. Moreover, the control device 20 calculates a light emission luminance from the image obtained from the imaging of light emitted from the pixel 15. Moreover, the control device 20 causes the ammeter 26 to measure current flowing in the organic EL element 16 by the application of the forward bias voltage or the reverse bias voltage to the pixel 15. Moreover, the control device 20 displays, on the monitor 21, the pixel information obtained through imaging by the CCD camera 25 and current measurement by the ammeter 26.

In the operational flowchart of Step S03 shown in FIG. 5, the control device 20 first detects the pixel having the organic EL element 46 with a short defect (S031).

A method of detecting the defective pixel includes a method of detecting a luminescence point generating leakage luminescence by the application of the reverse bias voltage to the organic EL element. In the normal pixel, current does not flow in the organic EL element 16 due to the reverse bias voltage. In the organic EL element 46 having the short circuit component 47, however, leakage luminescence caused by leakage current can be observed in the short circuit portion. With the image obtained by the imaging of the leakage luminescence state, a leakage luminescence point in the pixel is identified.

More specifically, the control device 20 applies a predetermined reverse bias voltage to the pixel 15 to be checked, and causes the source meter 22 to apply a reverse bias voltage to the pixel 15 to be checked. For example, common terminals each of which bundles the drain electrodes of all the drive transistors 17 in the display unit 12, the cathode electrodes of all the organic EL elements 16 in the display unit 12, and the gate electrodes of all the drive transistors 17 in the display unit 12 are provided on an end portion of the panel and then each of the common terminals is connected to the source meter 22. With this, a voltage of 15 V to 25 V is applied to the cathode electrode (K) of the organic EL element 16, and making the drain electrode (D) of the drive transistor 17 a GND potential. Moreover, during this time, the drive transistor 17 needs to be turned on such that the presence or absence of the leakage luminescence caused by reverse direction leakage current of the organic EL element can be observed. Therefore, during this time, for example, 0V is applied to the gate electrode (G) of the drive transistor 17. Moreover, when the leakage luminescence of the organic EL element is detected with the present technique, it is desirable that a reverse bias voltage is applied to the organic EL element 16 under a condition in which the drive transistor 17 is in a saturation region. With this, in the detection of the leakage luminescence, it is possible to restrict an influence of variations in characteristics of the drive transistor 17.

Moreover, for example, common terminals each of which bundles the cathode electrodes of all the organic EL elements 16 in the display unit 12, and the anode electrodes of all the organic EL elements 16 in the display unit 12 are provided on an end portion of the panel and then each of the common terminals is connected to the source meter 22. With this, a voltage of 15 V to 25 V is applied to the cathode electrode (K) of the organic EL element 16, making the cathode electrode (K) a GND potential.

Moreover, for example, a probe is in contact with all terminals for each of the pixels 15 included in the display unit 12, and then a predetermined reverse bias voltage is applied to the whole plane or a selected area. In this case, by causing a test pin to be contact with all terminals disposed in the whole of the display unit 12, the defective pixel to be checked and the normal pixel to be compared may be identified by a switch operation by a multiplexer or the like. Alternately, a test pin may be in contact with only a wiring of the pixel to be checked for measurement, and the test pin may be shifted to the display unit 12 and be in contact with the target pixel. Moreover, it is acceptable to hold a plurality of pins that is a block that is a plurality of pixel units, and to include a probe which can move on the display unit 12.

Next, the control device 20 identifies the luminescence point which produces leakage luminescence higher than or equal to a threshold intensity while the reverse bias voltage is applied. A method of identifying the luminescence point will be described in detail.

First, the control device 20 causes the CCD camera 25 to image a luminescence state of the pixel 15 to be checked in a period of the application of the reverse bias voltage. It should be noted that since the leakage luminescence caused by the application of the reverse bias voltage is weak, it is preferable to perform the imaging using the CCD camera in a complete light-shielding environment. Moreover, it is desirable that exposure time for the camera imaging is 5 seconds to 60 seconds and the condition of the exposure time is optimized by an S/N ratio. With this, it is possible to detect a luminescence point with high accuracy in an appropriate detection period. As a result, it is possible to detect a defective pixel with high accuracy. If the exposure time is too long, the luminance value by the weak leakage luminescence is averaged. Moreover, a noise level increases and the S/N ration decreases. Moreover, if the above described period is too short, the absolute value of the luminescence value by the leakage luminescence from the defective pixel is too small to obtain sufficient signal intensity.

Next, the control device 20 performs image processing on the image obtained by the camera imaging to extract imaging information about the each of the imaging points (coordinates and luminescence intensity). Then, from the imaging information of each of the imaging points, the luminescence point producing luminescence higher than a threshold intensity is identified as a leakage luminescence point. In other words, by binarizing the luminescence intensity at each imaging point with reference to the threshold intensity, whether or not the imaging point is the leakage luminescence point is determined. The pixel identified in this way is determined to be a shorted defective pixel. Finally, the control device 20 displays, on the monitor 21, the pixel determined to be a shorted defective pixel.

It should be noted that it is desirable that the CCD camera 25 is a cooled CCD camera. This allows securing a predetermined S/N ratio in the imaging of a weak leakage luminescence of the organic EL device. This accordingly eliminates noise in the check, to increase detection accuracy of the defective pixel.

With the above described operation, the control device 20 detects the luminescence pixel having the organic EL element 46 with a short defect, and Step S031 is completed. Step S031 corresponds to a defective pixel identification step.

It should be noted that the defective pixel identification step that is one of the steps in the manufacturing method for the organic EL display device according to the present disclosure is not limited to a method of detecting the leakage luminescence point to identify a defective pixel.

Return to the operational flowchart illustrated in FIG. 5. A method of manufacturing the organic EL device according to the present embodiment will be described.

Next, the control device 20 applies a predetermined reverse bias voltage to the pixel detected in Step S031 (S032). The application of a reverse bias voltage causes current to flow in the shorted defective portion having the short circuit component 47 for generating Joule heat, the shorted defective portion to reconstruct, and the shorted defective portion to be open. An operation of Step S032 will be described later in detail.

First, the control device 20 causes the drive transistor 17 of the pixel determined to be a shorted defective pixel to be turned on (S0321). This corresponds to preparation for flowing current in the shorted defective portion of the organic EL element 46. For example, when the maximum current load is supplied to the shorted defective portion, it is desirable that by setting a potential difference between the source electrode and the gate electrode of the drive transistor 17 to be large, the restriction of the current is not received by the drive transistor 17. For example, if the rate capability of the gate electrode is up to plus or minus 10 V, the gate voltage is set at −10 V.

Next, the control device 20 causes the source meter 22 to apply a reverse bias voltage to the pixel which is determined to be a shorted defective pixel in Step S031 (S0322). For example, a voltage of 15 V to 25 V is applied to the cathode electrode (K) of the organic EL element 46, and it is determined that the drain electrode (D) of the drive transistor 17 is a GND potential. When the absolute value of the reverse bias voltage that is a voltage applied to the cathode electrode is less than 15 V, the current caused by the reverse bias voltage preferentially flows in the shorted defective portion of the organic EL element. However, since Joule heat cannot be sufficiently generated for destructing the shorted defective portion, and it is impossible to certainly destroy the shorted defective portion. Moreover, when the absolute value of the reverse bias voltage is greater than 25 V, current flows also in the normal portion which exists in parallel with the shorted defective portion and melt fracture may occur to not only the shorted defective portion but also the stacked structure of the normal portion. The application of the reverse bias voltage in the above described voltage range makes it easier to cause the conductive foreign substance constituting the shorted defective portion to electrically change. With this, it is possible to preferentially flow an appropriate amount of current in the shorted defective portion for destroying the shorted defective portion without destroying the normal portion of the organic EL element 46.

In order to apply the reverse bias voltage to the organic EL element 46, a terminal connection is made between the cathode electrode and the anode electrode of the organic EL element 46, a voltage of 15 V to 25 V is applied to the cathode electrode (K) of the organic EL element 46 for making the anode electrode (A) a GND potential. In this case, regardless of the conduction state of the drive transistor 17, the reverse bias voltage can be applied to the organic EL element 46 and the above described Step 0321 can be skipped.

Next, the control device 20 causes the ammeter 26 to measure leakage current flowing in the organic EL element 46 while the reverse bias voltage is continuously applied in Step S0322. When variations in leakage current value do not exist or an increase in leakage current value is found in a predetermined period of applying the reverse bias voltage (No in S0323), the control device 20 determines that the pixel having the organic EL element 46 has no possibility to be repaired by the application of the reverse bias voltage. Laser repair is performed on the pixel (S036).

Meanwhile, when a decrease in leakage current value is found in a predetermined period of applying the reverse bias voltage (Yes in S0323), the control device 20 determines that the pixel having the organic EL element 46 has a possibility to have been repaired by the application of the reverse bias voltage. The application of the reverse bias voltage to the pixel is continued until the leakage current decreases to a predetermined current value (S0324). It should be noted that the predetermined current value is a value which is obtained after consideration of statistical measurement error range with respect to the value of current which flows when the reverse bias voltage is applied to the normal pixel.

Moreover, in Step S0324, when the decrease in the leakage current value is found but does not reach the predetermined current value, it is determined that the pixel having the organic EL element 46 has no possibility to be repaired by the application of the bias voltage. Laser repair is performed also on the pixel.

Moreover, the end point of the predetermined period of the application of reverse bias voltage is at the time of when the temporal change in leakage current value is saturated.

The above described Steps S0321 to S0324 correspond to Step S032. Step S032 corresponds to the reverse bias application step.

Next, the control device 20 applies, for a predetermined period, a bias voltage having absolute value that is less than or equal to the reverse bias voltage to the pixel which is determined to have a possibility to have been repaired by the application of the reverse bias voltage in Step S0324, to measure pixel current or light emission luminance (Step S033). In other words, this is a step for checking whether or not the pixel which is determined to have a possibility to have been repaired by the reverse voltage application is subsequently changed again to a shorted defective pixel. It should be noted that that the bias voltage at this time may be a forward bias voltage or a reverse bias voltage.

Here, first, a method of checking whether or not change occurs again after the application of the forward bias voltage will be described.

Figure 7:
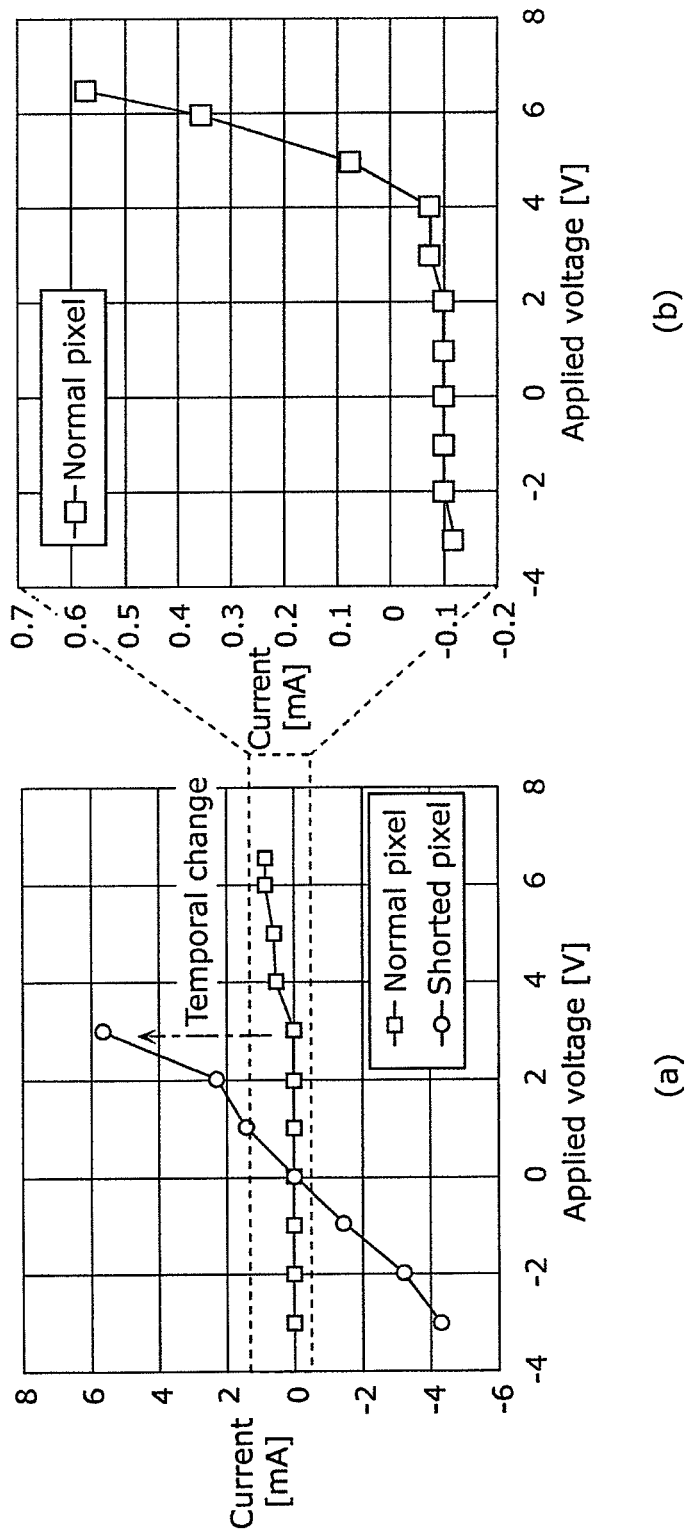
FIG. 7 is a graph which shows voltage-current characteristics of the organic EL element having a normal pixel and the organic EL element having a shorted defective portion, respectively.

FIG. 7 is a graph which shows voltage-current characteristics of the organic EL element having a normal pixel and the organic EL element having a shorted defective portion. Here, in (b) of FIG. 7, an extended version of the current axis of the graph shown in (a) of FIG. 7 is shown. First, based on the voltage-current characteristics of the normal pixel having nonlinear characteristics shown in (b) of FIG. 7, a forward bias voltage value corresponding to the maximum current at the time of the light-emitting operation is determined.

Then, the control device 20 applies the forward bias voltage value to the pixel to be checked for a predetermined period, and causes the ammeter 26 to measure pixel current flowing in the organic EL element for the predetermined period. Step S033 corresponds to a pixel characteristics measurement step.

Figure 8:
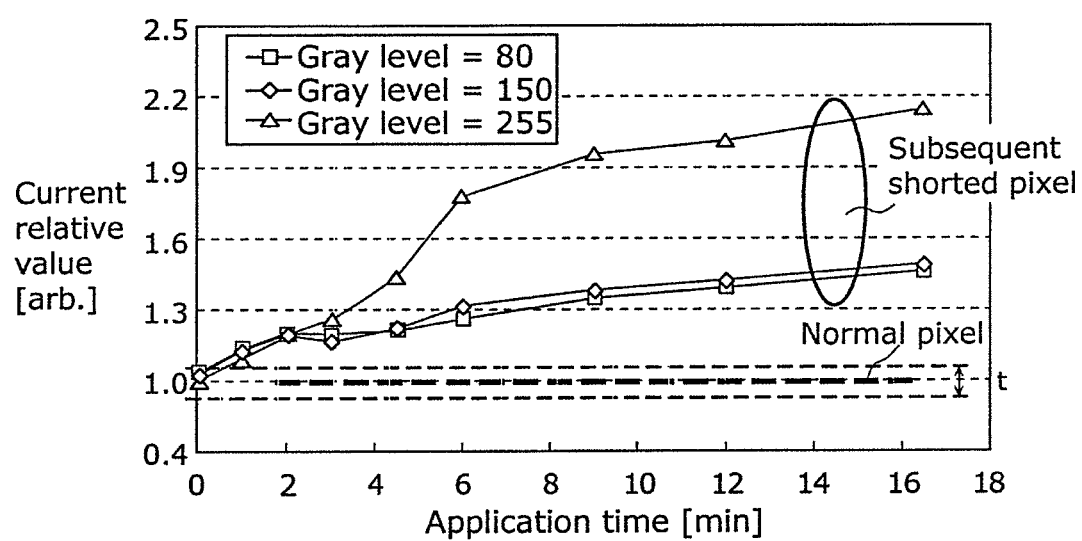
FIG. 8 is a graph for use in checking a subsequent defective pixel in the method of manufacturing the organic EL device according to one exemplary embodiment.

FIG. 8 is a graph for use in checking a subsequent defective pixel in the method of manufacturing the organic EL device according to the present embodiment. A horizontal axis indicates time for applying the determined forward bias voltage and a vertical axis indicates a current relative value which is based on the current value of the normal pixel. The graph shown in FIG. 8 describes variations in pixel current value when a forward bias voltage of a different value is applied to the pixel which is determined to have a possibility to have been repaired by the application of the reverse bias voltage in Step S0323. When a temporal change amount of the pixel current value at a predetermined time is calculated based on the measurement result and the change amount is less than or equal to a threshold t in the predetermined period (No in Step S034), that is, an uptrend in pixel current over time does not exist, it is determined that the pixel to be checked (dashed line in FIG. 8) is not subsequently changed again to a shorted defective pixel and then the repair process is completed (S035).

Meanwhile, when the temporal change amount is greater than a threshold t at any point of the predetermined period (Yes in Step S034), that is, an uptrend in pixel current exists over time, it is determined that the electrical repair performed in Step S032 is not perfect for the pixel to be checked (solid line in FIG. 8). It should be noted that the voltage-current characteristics of the pixel in a predetermined period temporally changes from the voltage-current characteristics of the normal pixel shown in (a) of FIG. 7 to the voltage-current characteristics of the shorted pixel. Laser repair is performed on the pixel (S036). Step S034 corresponds to a step for identifying a pixel that needs to be repaired, and Step S036 corresponds to a repair step.

Here, the change amount is a value which is obtained by dividing the absolute value of a difference between (i) pixel current measured at the starting point of the predetermined period in Step S033 and (ii) pixel current each measured at a corresponding one of the points of the predetermined period in Step S033, by the pixel current measured at the starting point of the predetermined period.

Moreover, the predetermined time is 10 minutes for example, and has a sufficient period of observing the temporal change in the pixel current to identify the subsequent shorted pixel.

When the pixel determined to have eliminated a short defect in Step 032 subsequently generates a short defect, the short defect comes to have a short circuit component 47. The short defect is reconstructed and the short circuit component 47 becomes low resistance over time by the continuous application of a predetermined forward bias voltage to the organic EL element 46 that comes to have the short circuit component 47. Therefore, by the continuous application of a predetermined forward bias voltage, current which flows in the organic EL element 46 monotonically increases over time due to low resistance of the short circuit component 47.

It should be noted that voltage-current characteristics are finally measured for the pixel which is determined not to change to a shorted defective pixel again in Step S034. It is desirable that repair is completed after determining that no difference exists between the voltage-current characteristics of the shorted defective pixel and the voltage-current characteristics of the normal pixel shown in FIG. 7.

It should be noted that in Step S033, light emission luminance may be measured, instead of measurement of pixel current, by the application of a forward bias voltage to the pixel to be checked. In this case, the control device 20 causes the source meter 22 to apply a forward bias voltage corresponding to the maximum light emission luminance. Moreover, the control device 20, for example, performs image processing on the image obtained by the CCD camera 25 to extract imaging information about the each of the imaging points (coordinates and luminescence intensity). Then, from the imaging information for each of the imaging points, the light emission luminance for the pixel to be checked may be calculated. When a temporal change amount of the pixel current value at a predetermined time is calculated based on the calculation result and the change amount is less than or equal to a threshold t in the predetermined period (No in Step S034), that is, no decrease in pixel current over time exists, it is determined that the pixel to be checked is not changed again to a short defective pixel subsequently and the repair is completed (S035).

Meanwhile, when the change amount is greater than a threshold t at any point of the predetermined period, that is, a downtrend in light emission luminance over time exists, it is determined that the electrical repair for the pixel to be checked in Step S032 is not perfect. Laser repair is performed on the pixel (S036).

Here, the change amount is a value which is obtained by dividing the absolute value of a difference between (i) light emission luminance measured at the starting point of the predetermined period in Step S033 and (ii) light emission luminance each measured at a corresponding one of the points of the predetermined period in Step S033, by the light emission luminance measured at the starting point of the predetermined period.

When the pixel determined to have eliminated a short defect in Step S032 subsequently generates a short defect, the short defect comes to have the short circuit component 47. The short defect is reconstructed and the short circuit component 47 becomes low resistance over time by the continuous application of a predetermined forward bias voltage to the organic EL element 46 that comes to have the short circuit component 47. Therefore, by the continuous application of a predetermined bias voltage, current which flows in the organic EL element 46 is dominated by current which flows in the short circuit component 47. This means that current which flows in the normal portion decreases and the pixel becomes a dark spot.

It should be noted that when the light emission luminance is measured in Step S033, a simple luminance meter may be used instead of the CCD camera 25.

It should be noted that voltage-current characteristics are finally measured for the pixel which is determined not to change to a shorted defective pixel again in Step S034. It is desirable that repair is completed after determining that no difference exists between the voltage-current characteristics of the shorted defective pixel and the voltage-current characteristics of the normal pixel.

It should be noted that it is desirable that the threshold of the change amount in Step S034 is 5%. By setting the threshold at 5%, when the temporal change amount in pixel current or light emission luminance which is detected by the application of a forward bias voltage for a certain period is determined by the threshold t, the threshold is caused to tolerate a predetermined error. With this, rather than determining a defective pixel by a slight temporal change in pixel current or light emission luminance stemming from measurement error or a factor other than the short defect, it is possible to accurately determine that only the light emission luminance in which a subsequent short defect in which the detected pixel current tends to monotonically increase over time and the detected pixel tends to monotonically decreases over time is generated again is a defective pixel.

It should be noted in Step S033 and later, whether a change occurs again to a defective pixel may be checked by the application of a reverse bias voltage rather than the above described forward bias voltage. Here, in Step S033 and later, a process of checking whether or not a change occurs again to a defective pixel after the application of the reverse bias voltage will be described.

Next, the control device 20 applies, for a predetermined period, a reverse bias voltage having an absolute value that is less than or equal to the reverse bias voltage to the pixel which is determined to have a possibility to have been repaired by the application of the reverse bias voltage in Step S0324, to measure pixel current or light emission luminance (Step S033). First, in a graph of the normal pixel having nonlinear characteristics shown in (b) of FIG. 7, the reverse bias voltage having an absolute value that is equal to the forward bias voltage corresponding to the maximum current at the light-emitting operation is determined.

The control device 20 applies the determined reverse bias voltage to the pixel which is determined to have a possibility to have been repaired by the application of the reverse bias pixel in Step S0324, and causes the ammeter 26 to measure pixel current which flows in the organic EL element for a predetermined period. When a temporal change amount of the pixel current value at a predetermined time is calculated based on the measurement result and the change amount is less than or equal to the threshold t in the predetermined period (No in Step S034), that is, an uptrend in pixel current over time does not exist, it is determined that the pixel to be checked does not change to a shorted defective pixel again and the repair is completed (S035).

Meanwhile, when the change amount is greater than the threshold t at any point of the predetermined period, that is, an uptrend in pixel current over time exists, the electrical repair for the pixel to be checked in Step S032 is not perfect. It should be noted that the voltage-current characteristics of the pixel in a predetermined period temporally changes from the voltage-current characteristics of the normal pixel shown in (a) of FIG. 7 to the voltage-current characteristics of the shorted pixel. Laser repair is performed on the pixel (S036).

When the pixel determined to have eliminated a short defect in Step S032 subsequently generates a short defect, the short defect comes to have the short circuit component 47. The short defect is reconstructed and the short circuit component 47 becomes low resistance over time by the continuous application of a predetermined reverse bias voltage to the organic EL element 46 that comes to have the short circuit component 47. Therefore, by the continuous application of a predetermined reverse bias voltage, current which flows in the organic EL element 46 monotonically increases over time due to low resistance of the short circuit component 47.

It should be noted that voltage-current characteristics are finally measured for the pixel which is determined not to change to a shorted defective pixel again in Step S034. It is desirable that repair is completed after determining that no difference exists between the voltage-current characteristics of the shorted defective pixel and the voltage-current characteristics of the normal pixel as shown in FIG. 7.

It should be noted that when the reverse bias current is applied to the pixel to be checked in Step S033, it is impossible to measure the light emission luminance instead of current.

Moreover, it is desirable that the bias voltage value which is applied in Step S033 is the maximum voltage value which is applied at the time of light-emitting operation by the pixel. With this, when the pixel which is a shorted defective pixel subsequently is specified, the most efficient acceleration check can be realized.

As described above, in Step S033 and later, both a method of applying the forward bias voltage and a method of applying the reverse bias voltage make it possible to check whether or not a change to a defective pixel occurs again. In the method of checking a change again to a defective pixel by the application of a forward bias voltage, light emission luminance measurement whose measurement is simpler than the measurement of current value can be applied. Meanwhile, in the method of checking a change again to a defective pixel by the application of a reverse bias voltage, the measurement is limited to the current value but it is possible to prevent deterioration of the organic EL element by luminescence.

As described above, the method of manufacturing the organic EL device includes identifying a shorted defective pixel, applying a reverse bias voltage to the cathode and the anode of the shorted defective pixel to open a shorted defective position, checking a possibility that a pixel is shorted again by the application of a forward bias voltage or a reverse bias voltage to the pixel, and performing laser repair. Therefore, it is possible to certainly prevent the subsequent occurrence of a defective pixel in the pixel that is repaired. With this, it is possible to simplify the manufacturing process, to send only the high-quality product without a subsequent pixel defect to the subsequent process, and to provide an organic EL display device having high reliability.

With this, in the application of the reverse voltage, a reverse bias voltage is continuously applied for eliminating the short defect of the organic EL element. It is determined that the pixel which leakage current detected by the application of the reverse bias current decreases to less than or equal to a predetermined value corresponding to elapsed time has eliminated the short defect, and then a pixel characteristics measurement is performed on the pixel. With this, since the pixel characteristics measurement is efficiently performed, the efficiency of the manufacturing process can be increased.

Moreover, it is determined that the pixel in which leakage current detected by the application of the reverse bias current does not decrease to less than or equal to a predetermined value even after a certain period does not eliminate the short defect, and then another repair process is performed on the pixel. With this, it is possible to cause the pixel which does not eliminate the short defect even after the application of a reverse bias voltage to certainly eliminate the short defect.

Although the exemplary embodiment has been described, the scope of the present disclosure is not limited to such. Those skilled in the art will readily appreciate that various modifications may be made in the exemplary embodiment without materially departing from the principles and spirit of the inventive concept, the scope of which is defined in the appended Claims and their equivalents.

It should be noted that in the system shown in FIG. 6, a forward bias voltage and a reverse bias voltage may be applied, instead of from the source meter 22, by selecting the pixel to be checked from the data line drive circuit 13 and the scanning line drive circuit 14 that are included in the organic EL display device 1.

Moreover, in the above described embodiment, the description is made about the case where Step 03 shown in FIG. 4 is applied to the display unit 12 in the manufacturing process for the organic EL display device 1. The same effect can be obtained from the application of Step S03 after the completion of the organic EL display device 1.

The herein disclosed subject matter is to be considered descriptive and illustrative only, and the appended Claims are of a scope intended to cover and encompass not only the particular embodiments disclosed, but also equivalent structures, methods, and/or uses.

INDUSTRIAL APPLICABILITY

A method of manufacturing an organic EL display device according to one exemplary embodiment disclosed herein is applicable to a technical field such as a display of a flat-screen television or a personal computer which requires a larger screen and a higher resolution.

The invention claimed is:

1. A method of manufacturing an organic electroluminescence (EL) display device which includes pixels, each of which includes an organic EL element, the method comprising:
   identifying, from among the pixels, a pixel that includes an organic EL element having a short defect as a defective pixel;
   applying a reverse bias voltage for eliminating the short defect to the pixel identified as the defective pixel in the identifying of the pixel, the reverse bias voltage being within a predetermined range;
   applying, for a certain period, a voltage having an absolute value that is at most equal to the reverse bias voltage to the pixel to which the reverse bias voltage is already applied in the applying of the reverse bias voltage, and measuring one of a light emission luminance and a pixel current of the pixel in the certain period;
   again identifying the pixel as the defective pixel that needs to be repaired when a temporal change amount in the one of the light emission luminance and the pixel current measured in the measuring is at least equal to a threshold; and
   repairing, by using a laser and after the reverse bias voltage is already applied to the pixel, the pixel using a technique different from the technique of applying the reverse bias voltage, the pixel being again identified as the defective pixel.

2. The method of manufacturing the organic EL display device according to claim 1,
   wherein in the applying of the reverse bias voltage, a leakage current is measured, and the reverse bias voltage is continuously applied until the leakage current is at most equal to a predetermined value, and
   in the measuring, the voltage is applied, for the certain period, to the pixel when the leakage current is at most equal to the predetermined value, and the one of light emission luminance and the pixel current of the pixel is measured.

3. The method of manufacturing the organic EL display device according to claim 2,
   the repairing is further performed on the pixel when the leakage current is greater than the predetermined value, even when the reverse bias voltage is applied for the certain period.

4. The method of manufacturing the organic EL display device according to claim 1,
   wherein an absolute value of the reverse bias voltage in the predetermined range in the applying of the reverse bias voltage varies from 15 V to 25 V inclusive.

5. The method of manufacturing the organic EL display device according to claim 1,
   wherein the temporal change amount is a value which is obtained by dividing an absolute value of a difference between the one of the light emission luminance and the pixel current that is measured in the measuring at a starting point of the certain period and the one of the light emission luminance and the pixel current that is measured in the measuring at a point of the predetermined period, by the one of the light emission luminance and the pixel current that is measured at the starting point of the predetermined period, and
   the threshold is 5 percent.

6. A method of manufacturing an organic electroluminescence (EL) display device which includes pixels, each of which includes an organic EL element, the method comprising:
   identifying, from among the pixels, a pixel that includes an organic EL element having a short defect as a defective pixel;
   applying a reverse bias voltage for eliminating the short defect to the pixel identified as the defective pixel in the identifying of the pixel, the reverse bias voltage being within a predetermined range;
   applying, for a certain period, a voltage having an absolute value that is at most equal to the reverse bias voltage to the pixel to which the reverse bias voltage is already applied in the applying of the reverse bias voltage, and measuring one of a light emission luminance and a pixel current of the pixel in the certain period;

again identifying the pixel as the defective pixel that needs to be repaired when a temporal change amount in the one of the light emission luminance and the pixel current measured in the measuring is at least equal to a threshold; and repairing the pixel using a technique different from the technique of applying the reverse bias voltage, the pixel being again identified as the defective pixel, wherein the temporal change amount is a value which is obtained by dividing an absolute value of a difference between the one of the light emission luminance and the pixel current that is measured in the measuring at a starting point of the certain period and the one of the light emission luminance and the pixel current that is measured in the measuring at a point of the predetermined period, by the one of the light emission luminance and the pixel current that is measured at the starting point of the predetermined period, and the threshold is 5 percent.

\* \* \* \* \*